United States Patent [19]

Krikorian et al.

[11] 4,033,843
[45] July 5, 1977

[54] SIMPLE METHOD OF PREPARING STRUCTURALLY HIGH QUALITY PBSNTE FILMS

[75] Inventors: Esther Krikorian, Claremont; Richard J. Sneed, Upland, both of Calif.

[73] Assignee: General Dynamics Corporation, Pomona, Calif.

[22] Filed: May 27, 1976

[21] Appl. No.: 690,705

[52] U.S. Cl. .......................... 204/192 P; 204/298
[51] Int. Cl.² ...................................... C23C 15/00
[58] Field of Search .......... 204/192, 192 SP, 192 S, 204/192 P

[56] References Cited

OTHER PUBLICATIONS

K. J. Linden et al., "High–Performance 8–14μmm $Pb_{1-x}Sn_xTe$ Photodiodes", Proc. IEEE, vol. 63, pp. 27–31, Jan. 1975.
C. Corsi et al., "Infrared Detector Arrays by R F Sputtering", Infrared Physics, vol. 12, pp. 271–275, 1972.
E. Krikorian, "Thin Film Electrooptical Devices", J. Vac. Sci. Tech., vol. 12, No. 1, Jan./Feb. 1975, pp. 186–187.
C. Corsi, "$Pb_xSn_{1-x}Te$ Layers by R F Multicathode Sputtering", J. Appl. Phys., vol. 45, Aug. 1974, pp. 3467–3471.
C. Corsi et al., "$Pb_xSn_{1-x}Te$ Epitaxial Layers by RF Multicathode Sputtering", Appl. Phys. Lett., vol. 24, May 1974, pp. 484–485.
C. Corsi et al., "Thin Film Infrared Detector Arrays for Integrated Electronic Structures", Infrared Physics, vol. 16, pp. 37–45, 1976.

Primary Examiner—John H. Mack
Assistant Examiner—Aaron Weisstuch
Attorney, Agent, or Firm—Henry M. Bissell; Edward B. Johnson

[57] ABSTRACT

The method of the present invention comprises depositing by sputtering, from a single target or source, a thin high quality single crystal film in a predictable and repeatable manner having the general formula $Pb_{1-x}Sn_xTe$, where $x$ may range from 0.00 to 0.30. The film has infrared sensing properties with a cutoff wavelength $\lambda_c$ from about 6μm to greater than 25μm. Structurally high quality film can be deposited on a large number of single crystal substrates of, for example $CaF_2$ (100 or 111) or $BaF_2$ (111), PbTe and PbSnTe, in a low pressure atmosphere by supported discharge sputtering or ion beam sputtering at substrate temperatures between about 220° and 350° C and at film growth rates from 0.1 to 3.0μm/hr. In the case of supported discharge sputtering the voltage to the target and/or the ion (plasma) current is varied to control the rate of film deposition. In the case of ion beam sputtering, the ion beam energy and/or ion beam current is varied to control the rate of film deposition.

13 Claims, 3 Drawing Figures

SIMPLE METHOD OF PREPARING STRUCTURALLY HIGH QUALITY PBSNTE FILMS

The invention herein described was made in the course of or under a contract or subcontract thereunder, with the Department of the Air Force.

BACKGROUND OF THE INVENTION

1. Field of the Invention

This invention relates to the deposition of thin films on a substrate and, more particularly, to the deposition of particular films to develop certain preselected film structural properties.

2. Description of the Prior Art

Thin film devices are of many types and may have many different uses. One class of such devices to which the present invention relates, but is not limited, is the subject of a Special Issue of the "Proceeding of the IEEE", January 1975, devoted to infrared technology for remote sensing. Particular devices of the type here involved but produced by another method are described in an article therein, beginning at p. 27, entitled "High-Performance 8-14$\mu$m $Pb_{1-x}Sn_xTe$ Photodiodes" by Kennedy et al.

Extended epitaxial layers for use in various types of semiconductor devices can be formed by various methods such as by solid state crystal growth from a multitude of small crystals, liquid phase epitaxy, vapor phase growth and deposition from various electrolytic baths with varying success. Certain methods now employ sputtering techniques for the production of silicon and germanium diode crystals, and even for certain binary and ternary component crystals. However, in most instances it has been found to be very difficult to reliably produce multicomponent single crystals in a manner so as to provide good control over their electrical, structural, and electro-optical properties. Moreover, the methods employed for such purposes usually are very expensive and time-consuming, ordinarily requiring extensive annealing of the generated films and/or other special post-deposition treatments to render the films useful. Accordingly, there is a need for a simplified, inexpensive method of producing selected semiconductor layers of single crystal multi-component films.

SUMMARY OF THE INVENTION

Such a method has now been discovered. The method reliably and consistently produces single crystal films of PbSnTe having preselected properties which render the films useful in infrared sensor and other applications. The method is substantially as set forth in the Abstract above. It is inexpensive, utilizes easily controlled low temperature sputtering techniques, and can dispense with conventional time-consuming post-deposition process steps such as annealing and the like. It overcomes limitations and complexities of other deposition techniques such as minimal thicknesses of uniform, high quality single cyrstal films or requirements for multiple sources, in turn requiring multi-temperature, multi-rate and/or multi-source composition controls. The low pressure sputtering process as implemented here insures film purities acceptable for high performance devices. In contrast to other sputtering methods, the method suggested here avoids surface degrading effects such as are caused by electron plasma bombardment during RF supported sputtering, while having a larger range of controllable deposition parameters, in particular ion kinetic energies, than other sputtering techniques.

In accordance with the present novel method, single crystal PbSnTe films of preselected composition to yield desired infrared sensing properties are sputtered onto selected single crystal substrates at a controlled film growth rate between about 0.1 and 3.0$\mu$m/hr and at a controlled substrate temperature between 220° and 350° C in the presence of a low pressure of argon, or other non-reactive sputtering gases. The appropriate combinations of substrate temperatures and film growth rates which consistently yield single crystal PbSnTe film are defined and are an integral part of the method. The substrate may also be subjected to a bias voltage to further extend the flexibility of control over the film's properties. Moreover, the sputtering gas may contain small amounts of gaseous additives such as $N_2$ or $O_2$, to modify the electrical and photoelectric properties of the film. The film thus deposited, after cooling, is ready for use in infrared sensors. The film may have compositions varying from about PbTe to about $Pb_{0.7}Sn_{0.3}Te$, and exhibit cut-off wavelengths $\lambda_c$ from about 6$\mu$m to 25$\mu$m at 77°K. The substrates may be any suitable single crystal substrates stable at the required substrate temperatures during the sputtering deposition.

BRIEF DESCRIPTION OF THE DRAWING

A better understanding of the present invention may be had from a consideration of the following detailed description, taken in conjunction with the accompanying drawings, in which.

DESCRIPTION OF THE PREFERRED EMBODIMENT

Figures 1, 2:
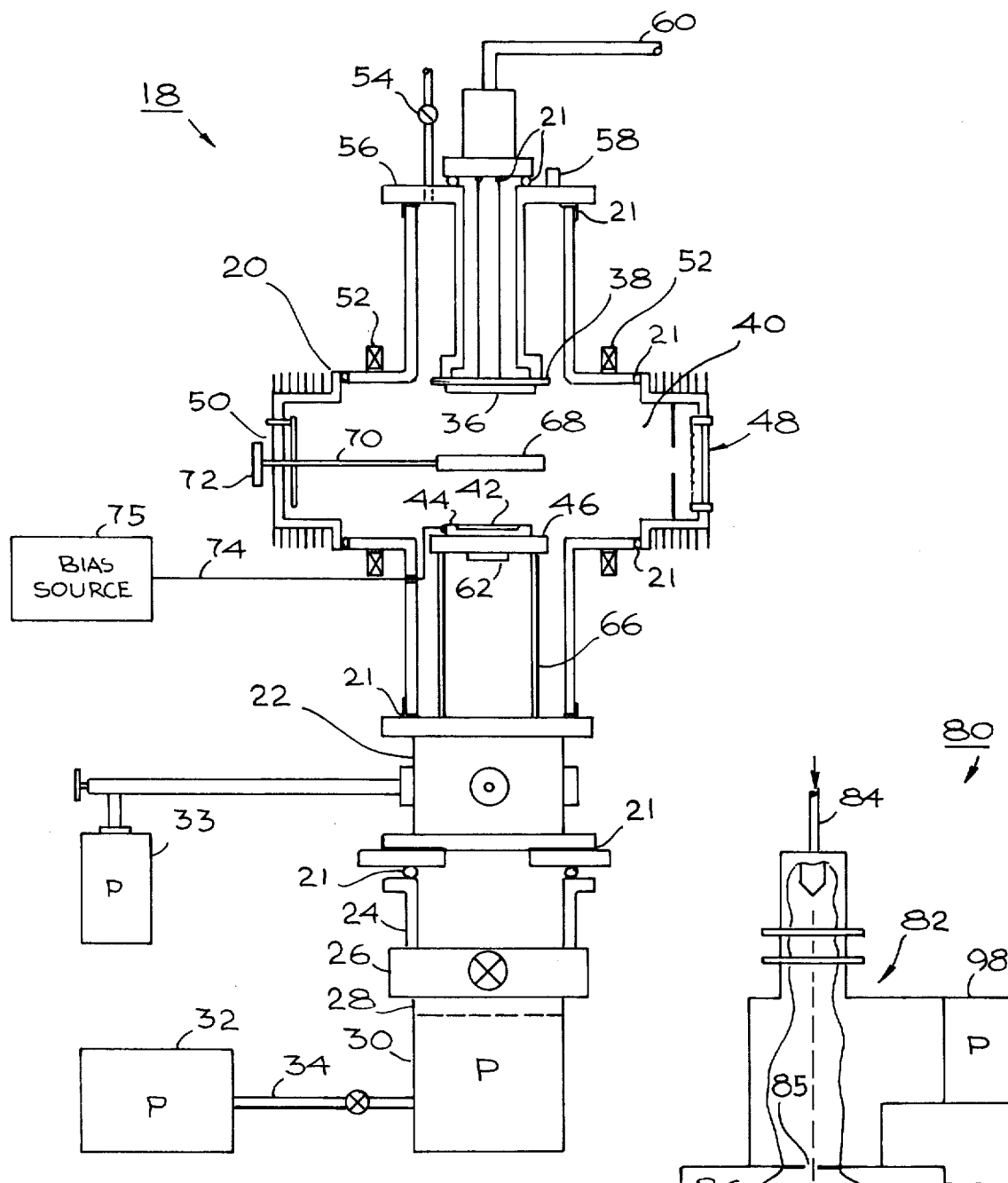
FIG. 1 is a schematic front elevation of a typical supported discharge or triode sputtering device which can be used in carrying out the present method.
FIG. 2 is a schematic front elevation of a typical ion beam sputtering device which can be used in carrying out the present method, portions being broken away to illustrate certain internal features.

Now referring more particularly to FIG. 1 of the accompanying drawings, a typical device is schematically depicted for carrying out supported discharge sputtering in accordance with one embodiment of the present method. In this regard, a supported discharge sputtering apparatus 18 is shown which has a cruciform-shaped reaction chamber 20 of, for example, about 6-inch-diameter cylinders, fabricated of high temperature glass, such as Pyrex type glass, or quartz or the like. It will be understood that chamber 20 and all components therein are maintained contaminant free. Moreover, high purity substrates, targets and gases are introduced, the target is sputter etched in-situ and the substrates thermally etched in-situ, both under high vacuum condition (about $10^{-7}$ torr) prior to initiation of deposition so that in chamber 20 reproducible high purity films are obtained through the use of the present method, more particularly described hereinafter. Thus, chamber 20 is sealed by suitable metal gaskets generally designated 21 and is disposed upon a ported collar 22 which is in turn disposed upon and sealed to a manifold 24 leading from and separated by a gate valve 26 and cryogenic trapping baffle 28 from a turbo-molecular or water-cooled diffusion pump 30, a mechanical foreline pump 32, a cryogenic roughing pump 33 and suitable interconnecting lines and valving generally designated 34. The pumps are designed to lower the pressure in chamber 20 to the low $10^{-7}$ torr range. A typical operating background pressure in the chamber in carrying out the method is about $1 \times 10^{-7}$ torr.

A source or target 36 having the formula $Pb_{1-x}Sn_xTe$, whereas $x$ may vary between about 0 and 0.3, is disposed and held in a horizontal position in a vertically movable holder 38 at the top of the wide horizontal cylinder section 40 in chamber 20, a predetermined but adjustable distance, usually of about 6 cm, directly above and parallel to selected single crystal substrates 42. Substrates 42 are disposed in a horizontal tantalum or other suitable low sputtering metal holder 44 on a receiving surface 46. A tungsten thermionic emitter 48 is located at one end of section 40 and a lower voltage anode 50 is located at the opposite end of section 40, the emitter 48 and anode 50 forming with target 36 and triode sputtering mechanism of device 18. Two focusing magnets 52 are disposed at opposite sides of section 40 between emitter 48 and anode 50. In utilizing apparatus 18, a voltage is applied to target 36. This voltage can either be alternating current or direct current. Since the target material 36 is electrically conductive, the direct current mode is preferred and is usually maintained by a direct current supply with a maximum 10 Kv, 50 ma capacity.

Ultra high purity argon gas, or in some instances other suitable gas, for example, neon, after passing through a gas purifier (not shown) enters chamber 20 through a controlled leak line and valve generally designated 54 in the top plate 56 of chamber 20. The gas is added to chamber 20 only after chamber 20 has been evacuated to the previously indicated low pressure (e.g. about $2 \times 10^{-7}$ torr) by means of pump 30, pump 32 and pump 33. The gas thus introduced into chamber 20 through the leak line and valve 54 can be measured through a suitable gauge (not shown) attachable through a connector 58 in top plate 56 of chamber 20. The pressure of the argon gas in chamber 20 generally is in the range of about 0.5–5$\mu$m. A diffuse plasma is produced which extends between the thermionic emitter 48 and low voltage anode 50 in a chamber 20 and also between target 36 and substrate 42.

The target 36 is water-cooled, as through a line 60, passing to target holder 38. The temperature of the substrates 42 can be easily controlled within desired limits, through the use of a heater 62 disposed immediately below surface 46 and powered through suitable connections passing through port or collar 22. It will be noted that surface 46 is adjustable vertically by means of a movable support stand 66 on which it rests.

A push-pull shutter 68 is interposed directly between target 36 and the substrates 42 and is adjustable by means of a control rod 70 and vernier type control know 72 external of chamber 20. Shutter 68 permits a plurality of simultaneous experiments, if desired, to be carried out after a single pumpdown of chamber 20. Thus, for example, substrate holder 44 can be designed to accommodate nine separate substrates 42 arranged in three rows. Shutter 68 can be adjusted to permit exposure of one, two or all rows of the substrates (and thus three, six or all nine substrates) to sputtering deposition at one time and under one to three sets of conditions.

TARGET PREPARATION

In order to carry out the method of the present invention, it is necessary to prepare a suitable target such as target 36. As previously indicated, the target has a formula $Pb_{1-x}Sn_xTe$ where $x$ may vary between 0.0–0.3. It can be prepared either from the elements lead, tin and tellurium, all of a high degree of purity, for example 6 N purity or the like, of from two compounds in equally purified form, PbTe and SnTe. The preparation of the targets typically involves reacting the elements or the indicated compounds in the desired ratios in a clean quartz reaction vessel sealed under vacuum. Special sealing flasks can be selected for the reactor vessel so as to form the target into the desired shape. Usually, the target-forming reaction is carried out at about 1000° C, for about 6 hours while the reaction vessel is disposed in a vacuum furnace, after which the thus-formed target is cooled at a required slow cooling rate of between approximately 200°–400° C per hour or the like. After the target has cooled, it can be removed from the reaction vessel, and can be shaped, as by lapping, and then cleaned, as by electrochemical etching or the like, well known in the art, in order to provide it with a clean shiny surface. Target 36 can then be attached to holder 38 in part comprising, for example, a high purity copper backplate, as by soldering, utilizing a conductive silver epoxy to provide good electrical and thermal contact but selecting the location of the epoxy so that it will not be exposed to the sputtering plasma and thus cause contamination of the source or deposited film.

SUBSTRATE PREPARATION

In order to carry out the present method it is also necessary to provide the suitable substrate 42 in single crystal form. Any suitable substrate capable of withstanding the operating temperatures encountered by substrate 42 during the sputtering deposition can be used. For example, single crystal rods of calcium fluoride, $CaF_2$, and barium fluoride, $BaF_2$, in either (100) or (111) crystal direction can be used as the starting material. In these cases, the (111) orientated rod material is cleaved in the (111) plane into wafers of desired thickness, typically about 0.050 inches while the (100) orientated material is cut with a diamond saw into wafers of the desired thickness. The (100) surfaces can be checked for orientation by cleaving the crystal slices in two different directions and measuring the angle between the cleavage plane and the cutting plane. The resulting wafers are then lapped or otherwise shaped on a mechanical lapping wheel or the like with successively finer grinding compounds ranging from about 5$\mu$ to about 0.5$\mu$. They then can be polished on a silk-covered polishing wheel or the like to provide the substrate with a finished shape and polished form.

In accordance with one embodiment of the method of the present invention, the substrate or substrates 42, as the case may be, is or are placed into the tantalum or other low sputter yield metal substrate holder 44 in device 18 and the target 36 is attached in the previously indicated manner to holder 38.

THE DEPOSITION PROCESS

After insertion of the substrate(s) 42 the substrate 42-to-target-36 distance is adjusted, usually to about 6 cm, reaction chamber 20 is evacuated to a background pressure of about $1 \times 10^{-7}$ torr or below, and ultra high purity argon is introduced into chamber 20 through line and valve 54 to a controlled pressure between 0.5μm Hg and 5μm Hg as required. The previously described triode system, preferably operating in a direct current mode, is then activated to effect the sputtering deposition of target material 36 as a single crystal film on substrate 42, with the diffuse argon plasma disposed between emitter 48 and anode 50, target 36 and substrate 42. Target 36 is subjected to a controlled, preferably direct current, voltage to regulate the film growth rate on substrate 42 while the temperature of substrate 42 is maintained as desired by heater 62 to assure the film is single crystal in nature. The concentration of sputtering gas is constantly controlled by means of a needle valve (not shown) and monitored by vacuum gauges and the like (not shown) to keep it in the desired range so that the method proceeds smoothly until the desired thickness of film is deposited, for example, between about 0.01μm and about 10.0μm. It will be understood that any suitable film thickness can be obtained. However, thin films of up to about 5μm are usually desired for sensing systems. The film has the composition $Pb_{1-x}Sn_xTe$ wherein x can frange from 0.0 to about 0.3.

Figure 3:
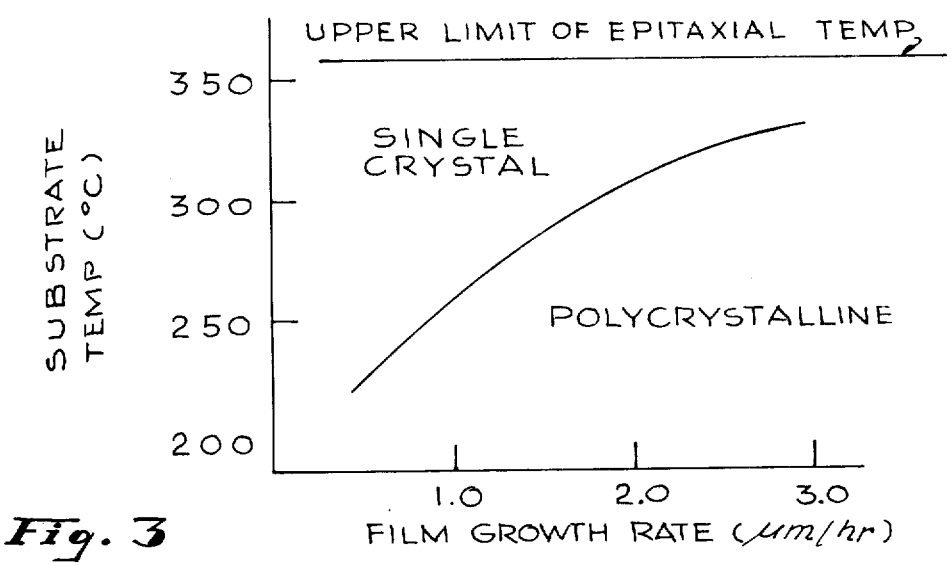
FIG. 3 is a graph showing a substrate temperature plot plotted against selected PbSnTe film growth rates, and delineating typical conditions for producing single-crystal, selected PbSnTe films from a given target having infrared sensitivity.

Now referring more particularly to FIG. 3 of the accompanying drawings, a graph is presented in which the range of substrate temperatures, controlled as previously indicated by heater 62, and the range of film growth rates at which film of all $Pb_{1-x}Sn_xTe$ compositions between $x = 0.0$ and 0.3 grows on substrate 42 so that the film so deposited will be monocrystalline. FIG. 3 shows that these ranges are about 225° C to 350° C for the substrate temperatures and about 0.1μm per hour to 3μm per hour for the growth rate. Any combination of substrate temperatures and growth rates that falls within the boundaries indicated in FIG. 3 can be selected to achieve the desired monocrystalline film structure. FIG. 3 shows that films deposited at insufficient substrate temperatures for the film growth rates involved or at growth rates that are two large for the substrate temperatures selected are polycrystalline. FIG. 3 shows also that epitaxial films also are impossible where the substrate temperature exceeds about 360° C since fibrous films are always formed above that temperature. Selection of specific combinations of substrate temperatures and growth rates within the allowable range provides the freedom to achieve desired film compositions or the most convenient conditions such as the lowest possible substrate temperature. Thus, FIG. 3 provides the criteria for operating device 18 so that the present method yields the desired single crystal infrared sensitive films. These criteria can vary slightly with the sputtering environment such as sputtering gas pressure and ion beam energy but can be equally well defined for any environment.

In all instances when the present method is carefully carried out in a device of the type depicted in FIG. 1 in accordance with the above criteria, the resulting films are monocrystalline and exhibit a crystal quality comparable to that of the substrate. For example, when single crystal $Pb_{1-x}Sn_xTe$ films, with x at any value between 0.0 and 0.3, are sputtered on single crystal $CaF_2$ (111) wafers and single crystal $BaF_2$ (111) wafers, the films shown (111) orientation, while those single crystal films which are deposited on single crystal $CaF_2$ (100) wafers shown the (100) orientation. In the case of those films deposited on cleaved $CaF_2$ (111) and $BaF_2$ (111) substrates, Kikuchi lines can be observed in both the film and substrate, thus evidencing excellent structural quality.

In a first series of tests, a target having the composition $Pb_{.70}Sn_{.30}Te$ is deposited as a monocrystalline film of about 1μm thickness on a plurality of single crystal substrates consisting of 0.050 inch thick wafers of $CaF_2$ (100) and $BaF_2$ (111) in the present method utilizing device 18 evacuated to $4 \times 10^{-7}$ torr, with an argon pressure of about 3μm, a substrate temperature between 300° C and 350° C and a film growth rate between about 1 and about 2μm per hour controlled by a direct current target voltage. The films thus produced in all instances are monocrystalline PbSnTe and exhibit good thermomechanical stability and infrared sensing properties.

In a second series of parallel tests utilizing device 18 and the same types of substrates, targets and conditions as in the first series except for a film growth rate of between about 2.0 and about 2.8μm/hr and substrate temperatures between about 325° C and 350° C, identical results are obtained.

In a third series of parallel tests, utilizing the same substrates and conditions as in the first series except that the substrate temperature is kept between about 225° C and 275° C and the film growth rate is kept about 0.5μm/hr, again essentially the same results are obtained.

In a further series of tests, the test conditions of the first three series are duplicated, except that the targets all have the composition $Pb_{.85}Sn_{.15}Te$ and the argon is at a pressure of about 4μm. The same results are obtained as in the first three series, all sputtered films being monocrystalline and infrared sensitive and having high thermomechanical stability.

Further, typical tests and results are summarized in Table I below:

TABLE I

| Sample | Substrate | Film Growth Rate μm/hr | Substrate T° C | Film Thickness (μm) | Film Structure |
|---|---|---|---|---|---|
| 1A | CaF$_2$(111) | .503 | 322 | .88 | SC |
| 2A | BaF$_2$(111) | .500 | 350 | 1.34 | SC |
| 3A | CaF$_2$(111) | .42 | 300 | .928 | SC |
| 4A | CaF$_2$(111) | 1.0 | 325 | 2.04 | SC |
| 1B | CaF$_2$(111) | 1.00 | 300 | 0.99 | SC |
| 2B | CaF$_2$(100) | 1.0 | 360 | 1.0 | F |
| 3B | CaF$_2$(111) | 2.28 | 375 | 1.43 | F |
| 4B | CaF$_2$(111) | 0.85 | 220 | .85 | PC |
| 5B | CaF$_2$(111) | .44 | 225 | .44 | SC |
| 6B | CaF$_2$(100) | 1.53 | 270 | 1.89 | SC |
| 1C | BaF$_2$(111) | 0.30 | 300 | .93 | SC |
| 2C | CaF$_2$(111) | 0.85 | 354 | 3.08 | SC |
| 3C | BaF$_2$(111) | 1.10 | 307 | 1.17 | SC |

SC = Monocrystalline; PC = Polycrystalline; F = Fibrous
A — Target $Pb_{.70}Sn_{.30}Te$
B — Target $Pb_{.85}Sn_{.15}Te$
C — Target $Pb_{.85}Sn_{.15}Te$ As can be seen above, substrate temperatures of about 360° C and above result in fibrous deposited films (Samples 2B and 3B). Below about 220° C the films are polycrystalline (Sample 4B).

Accordingly the present method can be advantageously carried out by a supported discharge sputtering technique utilizing a device such as device 18 to predictably provide monocrystalline films of high quality on selected crystal substrates.

Now referring more particularly to FIG. 2 of the accompanying drawings, one type of ion beam sputtering system 80 is schematically depicted with portions broken away to illustrate certain internal components. The particular system 80 depicted includes a duoplasmatron acceleration section 82 of standard design into which high purity argon or other inert gas of desired mass is injected via a line 84 and wherein it is ionized, accelerated through a voltage ranging from about 0 to about 30 Kv. Electro-optical elements (not shown) focus and collimate the ions in a controllable manner. The resulting ion beam then passes through a small orifice into an ultra high vacuum chamber 86 and is directed to impinge on a sputtering target 88, causing sputtering of the target material 88 and deposition of the same on the selected single crystal substrate or substrates 90 disposed in holder 92 of tantalum or the like.

A movable shutter 94 is disposed between target 88 and substrate 90 so that one or more of substrates 90 in holder 92 can be blocked off or simultaneously exposed to the sputtering material 88. It will be noted that target 88 may be set at various angles from the normal to the ion beam axis, for example, at a 45° angle or so that the argon ion beam (shown in dotted outline in FIG. 2) can impinge on target 88 and cause the sputtered target material to strike substrate 90 at desired angles of incidence.

The described sputtering deposition in the ion beam device 80 takes place in an exceptionally low contaminant mode, utilizing a typical background pressure of about $1 \times 10^{-8}$ torr or less, and a working pressure (with the argon beam on the cooled target and the heated substrate) of about $1.5 \times 10^{-7}$ torr. Suitable cooling lines (not shown) run to the target holder 89, which can hold up to 4 targets 88, to controllably cool the target(s) 88. A heater 96, as shown in FIG. 2, is disposed adjacent to substrate holder 92 to control the temperature of substrate 90 within the desired limits. A cryo trapped 6-inch diffusion pump 98 or the like in the accelerator section 82 and a larger cryo trapped 10-inch diffusion pump 100 or the like in the high vacuum chamber 86 can be used to control the pressure and atmosphere in those two sections.

The temperature of substrate 90 and the rate of film deposition thereon are controlled, in carrying out the present method in device 80, in accordance with criteria such as depicted in the diagram in FIG. 3. In this manner it can again be insured that the film deposited on substrate 90 in an ion beam sputtering system such as the system 90 depicted in FIG. 2 is predictably single crystalline in nature. Thus similar conditions of substrate temperature and film growth rate as described previously in connection with the use of apparatus 18 of FIG. 1 are used in the operation of device 80 in accordance with the present method. Moreover, preparation of target 88 is identical to that of target 36 and preparation of substrate 90 is identical to that substrate 42. Target 88 can have the same range of composition of $Pb_{1-x}Sn_xTe$ as Target 36, i.e. $x$ may range from 0.0 to about 0.30. Substrate 90 can again be any suitable single crystal substrate stable at the operating temperature as was the case for substrate 42. For example, the previously described calcium fluoride and barium fluoride single crystals can be used, among other substrates.

In a series of parallel tests, target 88 is varied in composition from $x = 0.1$ to $x = 0.2$ and $x = 0.3$. In each run utilizing device 80 and the present method, a plurality of substrates 90 are used. Thus, one substrate is $CaF_2$ (111) a second is $BaF_2$ (111), and a third $CaF_2$ (110). The background pressure is about $1 = 10^{-8}$ torr and the working pressure about $1.5 \times 10^{-7}$ torr. Ultra high purity argon gas is used. An acceleration voltage of about 20 KV is used in device 80. Various substrate temperatures from about 220° C to 350° C and film growth rates between about 1.1 and about 2.8μm/hr are used, with the lower rates being utilized with the lower temperatures and the higher rates with higher temperatures, all in accordance with the graph of FIG. 3 so that the thus-deposited film is monocrystalline. In each instance, the method is carried out until the epitaxial film produced on substrate 90 has a thickness of about 1-3μm. Each film so produced is a single crystal, of high structural quality, of formula $Pb_{1-x}Sn_xTe$ where $x$ = about 0–0.3 depending on the particular conditions used, and is useful in infrared sensing applications. Accordingly the present method can be successfully carried out utilizing ion beam sputtering techniques in a device such as device 80.

Various modifications, changes, alterations and additions can be made in the present method, including the use of small amounts of gaseous additives to the sputtering gas for film property control, the use of substrate bias control for the same purpose, the steps and parameters thereof, as well as various types of sputtering apparatus of the plasma or ionbeam type carrying out the method. All such modifications, variations, alterations and changes as are within the scope of the appended claims form part of the present invention.

What is claimed is:

1. A method of predictably preparing high structural quality, single-crystal $Pb_{1-x}Sn_xTe$ films having infrared sensing properties, said method comprising:

sputtering from a single $Pb_{1-x}Sn_xTe$ target a single crystal $Pb_{1-x}Sn_xTe$ film on a selected single crystal substrate in a selected inert gas atmosphere in a reaction zone at pressures below 10μm after first having evacuated said reaction zone to at least about $10^{-7}$ torr, said sputtering employing control of substrate temperature and film growth rate where substrate temperature is selected from a range from about 220° to about 350° C and the film growth rate is selected from a range from about 0.1 to about 3.0μm/hr., with the higher of said growth rates typically used with the higher of said temperatures and the lower of said growth rates typically used with the lower of said temperatures.

2. The method of claim 1 wherein said selected inert gas atmosphere consists essentially of argon.

3. The method of claim 1 wherein said film has the formula $Pb_{1-x}Sn_xTe$ where $x$ can range from 0.0 to about 0.3.

4. The method of claim 3 wherein said sputtering target is $Pb_{1-x}Sn_xTe$ wherein $x$ can range from 0.0 to about 0.3.

5. The method of claim 4 wherein said sputtering target is prepared by reacting high purity constituents selected from the group consisting of (A) Pb, Sn and Te, and (b) PbTe and SnTe at elevated temperature in a vacuum zone to form $Pb_{1-x}Sn_xTe$ wherein $x$ is preselected to be between about 0 and 0.3, thereafter slowly cooling the resulting target and dimensioning and cleaning the target to provide a clean shiny surface.

6. The method of claim 5 wherein said target forming reaction is effected at about 1000° C for about 6 hours, wherein said cooling is effected at a specified rate between about 200° and 400° C/hr and wherein said dimensioning is effected by lapping said target.

7. The method of claim 1 wherein said sputtering comprises supported discharge sputtering, wherein high purity argon is introduced into said reaction zone to about 0.5–5 $\mu$m after said zone has been evacuated to at least about $4 \times 10^{-7}$ torr, and wherein said sputtering target is conductively mounted on a cooled target holder.

8. The method of claim 7 wherein said target holder has a voltage applied which is variable to about 10 KV maximum with a resulting plasma current of 50 ma capacity, and wherein said film deposition rate is controlled by said target voltage and current.

9. The method of claim 1 wherein said sputtering comprises ion beam sputtering, wherein high purity argon is injected into a duoplasmatron acceleration section and is ionized, accelerated through a voltage controllable in a range of about 0–30 KV, electrostatically focused, collimated, passed to a high vacuum zone, and impinged on said target.

10. The method of claim 9 wherein the background pressure is about $1 \times 10^{-8}$ torr, the working pressure is about $1.5 \times 10^{-7}$ torr and the target is $Pb_{1-x}Sn_xTe$ wherein $x$ is in a range between 0 and about 0.3.

11. The method of claim 1 wherein said substrate comprises (111) plane single crystal $CaF_2$.

12. The method of claim wherein said substrate comprises (111) plane single crystal $BaF_2$.

13. The method of claim 1 wherein said substrate comprises (100) plane single crystal $CaF_2$.

* * * * *